United States Patent
Chen et al.

(10) Patent No.: US 6,320,269 B1
(45) Date of Patent: Nov. 20, 2001

(54) METHOD FOR PREPARING A SEMICONDUCTOR WAFER TO RECEIVE A PROTECTIVE TAPE

(75) Inventors: Sen-Fu Chen; Kuei-Jen Chang, both of Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/304,303

(22) Filed: May 3, 1999

(51) Int. Cl.⁷ .................................................. H01L 23/28
(52) U.S. Cl. .......................... 257/787; 438/612; 438/464
(58) Field of Search ..................................... 438/612, 673, 438/640, 701, 464, 460; 257/787, 783

(56) References Cited

U.S. PATENT DOCUMENTS

| | | | |
|---|---|---|---|
| 4,645,562 | * 2/1987 | Liao et al. | 156/643 |
| 5,268,065 | 12/1993 | Grupen-Shemansky | 156/630 |
| 5,302,554 | 4/1994 | Kashiwa et al. | 437/227 |
| 5,366,589 | * 11/1994 | Chang | 156/657 |
| 5,593,927 | * 1/1997 | Farnworth et al. | |
| 5,731,243 | 3/1998 | Peng et al. | 438/612 |
| 5,851,911 | * 12/1998 | Farnworth | 438/614 |

FOREIGN PATENT DOCUMENTS

62166523 * 7/1987 (JP).
09213662 * 8/1997 (JP).

* cited by examiner

*Primary Examiner*—C. Everhart
(74) *Attorney, Agent, or Firm*—George O. Saile; Stephen B. Ackerman; William S. Robertson

(57) ABSTRACT

A protective tape is applied to the device side of a wafer (to protect it during an operation to grind the back side of the wafer) after the surface has been prepared to present only sloping surfaces to the tape. This profile prevents the otherwise sharp edges of the holes for the bonding pads from cutting into the adhesive of the tape and causing adhesive particles to remain on the wafer surface after the tape has been removed. Particles of resist can interfere with attaching wires to the bonding pads. The tape receiving surface of the wafer is commonly formed by a passivation layer and by bonding pad sites that are exposed through holes in the passivation layer. These sloping profiles can be formed by giving a sloping profile to the holes in the photoresist before the holes are etched. Alternatively the holes can be etched suitably wider at the top than at the bottom.

10 Claims, 2 Drawing Sheets

METHOD FOR PREPARING A SEMICONDUCTOR WAFER TO RECEIVE A PROTECTIVE TAPE

A RELATED APPLICATION

Figure 1A:
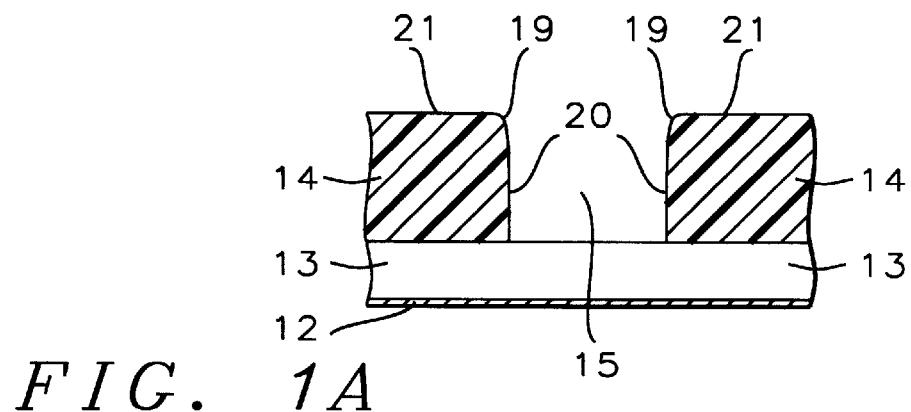

This application is related to application Ser. No. 09/160,964 filed Sep. 25, 1998 for "Improved Method for Etching Passivation Layer of Wafer", assigned to the assignee of this invention (TSMC97-312).

FIELD OF THE INVENTION

This invention relates generally to the manufacture of semiconductor wafers and more specifically to an improved process for forming holes in a passivation layer that an adhesive tape is applied to for protecting the wafer during a grinding operation.

INTRODUCTION

As the related application explains, after most of the operations on the device side of a wafer have been completed, a grinding operation is performed on the back side of the wafer to give the wafer a selected thickness. A tape is applied to the device surface of the wafer to protect it during this grinding operation. This surface is formed by the upper surface of the passivation layer and the bonding pads that are exposed through holes formed in the passivation layer. The tape has a plastic backing and an adhesive. When the tape is removed, particles of adhesive sometimes remain on the device side of the wafer and on or near the bonding pads. These particles can interfere with later operations such as welding wires to the bonding pads of a chip.

SUMMARY OF THE INVENTION

This invention is directed to the problem that the adhesive can stick to the bonding pads. I modify the normally sharp edges of the holes in the passivation layer to give them a sloping profile. The bonding tape does not pass over sharp corners that liable to cut into the adhesive and thereby cause particles of adhesive to be left on the bonding pads.

In one embodiment, a photoresist is conventionally formed over the passivation layer and holes for the bonding pads are conventionally formed in the photoresist. These holes in the photoresist layer have approximately vertical side walls and sharp edges where the side walls meet the upper surface of the resist. These sharp edges are then removed, preferably by an oxygen plasma treatment. The passivation layer is then etched in the usual way and the resulting holes in the passivation layer are given a sloped profile that permits the tape to be removed without leaving behind particles of adhesive.

In a second embodiment of my invention, the photoresist is left with the usual sharp edges but the holes in the passivation layer are etched with an isotropic etch. (Conventionally this etch is anisotropic.) The isotropic etch operates both vertically and horizontally and as is well known in other etch steps, the hole is given a greater diameter at the top than at the bottom. The resulting hole in the passivation layer has a sloping profile which helps to avoid cutting the adhesive and thereby causing adhesive particles to remain on the wafer.

Other objects and features of the invention will appear in the description of these embodiments of the invention.

THE DRAWING

Figure 1B:
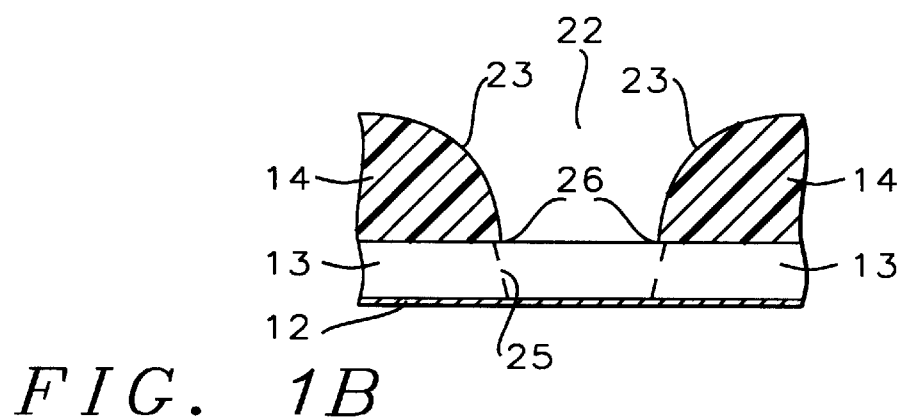
Figure 1C:
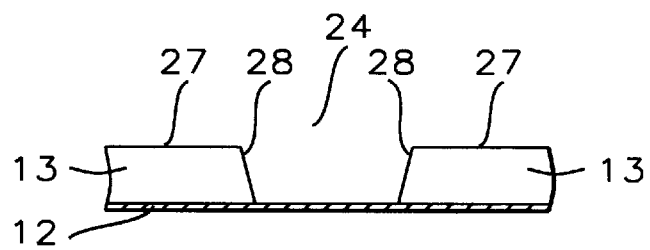

FIGS. 1A, 1B, and 1C show a section of a wafer at successive stages of a process in which the wafer is prepared for receiving an adhesive tape that will protect it during a grinding operation.

Figure 2A:
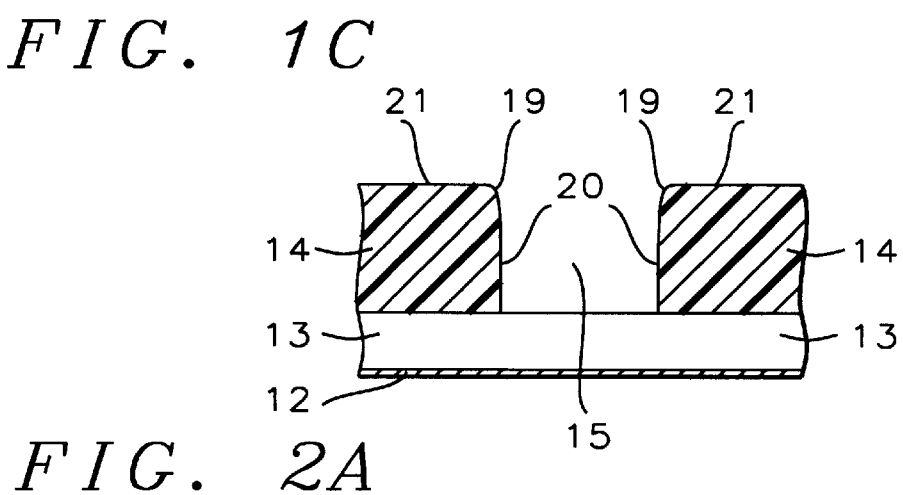
Figure 2B:
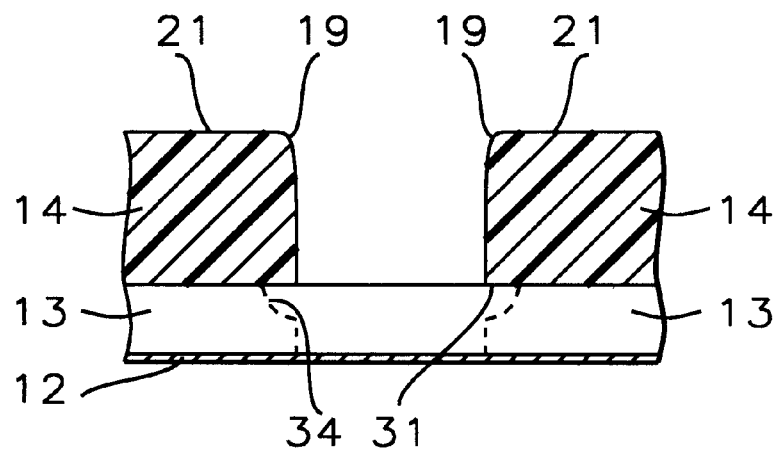
Figure 2C:
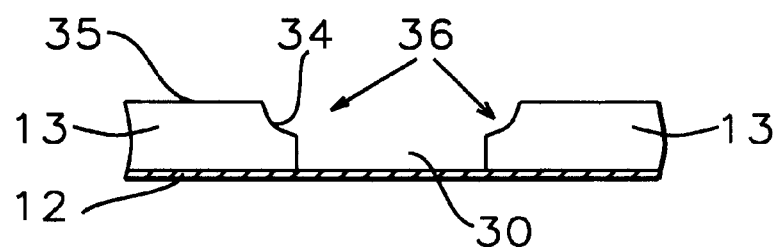

FIGS. 2A, 2B, and 2C are similar to FIGS. 1A, 1B, and 1C and show a second process for preparing the wafer to receive a tape.

THE EMBODIMENT OF FIGS. 1A, 1B, AND 1C

FIG. 1A shows a layer 12 of a conductor (for example, a metal film). The conductor layer overlies a semiconductor substrate and any structures between the substrate and layer 12. The substrate and intervening structures are well known and are not shown in the drawing. In a processing step before the wafer reaches the state represented by FIG. 1A, layer 12 is etched to form conductive patterns that interconnect circuit nodes below the conductive layer. As is conventional, some of the conductor patterns of layer 12 are later connected to wires that lead to external circuit nodes.

A passivation film 13 overlies the conductive layer and protects conductor layer 12. A passivation layer can be made of various materials such as silicon dioxide and silicon nitride, as is well known. A photoresist layer 14 is formed over the passivation layer, and FIG. 1A shows a representative opening 15 that has been formed in photoresist layer 14 for an etch operation that forms an opening 17 in the passivation film 13 to permit wires to be welded to a circuit node of layer 12. Hole 15 of FIG. 1A has a normal profile with a sharp edge 19 where the sides 20 of the hole meet the upper surface 21 of photoresist layer 14. (In the single hole shown in FIG. 1A, the edge 19 of hole 15 is continuous and approximately circular as seen from the top.)

It is a feature of my invention that the normal profile of hole 15 in FIG. 1A is modified to form the hole 22 of FIG. 1B which has a profile with a sloped surface 23 instead of the sharp edge 19. This effect is preferably achieved by treating the wafer of FIG. 1A with an oxygen ($O_2$) plasma etch that removes the sharp edges 21 of the normal holes represented in FIG. 1A.

The passivation film 13 is etched through the photoresist 14 with the sloped profile. The resulting hole 24 in film 13 has tapered shape shown by dotted lines 25 in FIG. 1B. Note that passivation layer hole 24 extends slightly under the lower edge 26 of the photoresist surrounding hole 22, as is common with various etch techniques. Photoresist layer 14 is then stripped from the wafer to leave the structure represented in FIG. 1C.

When the oxygen plasma etch is performed in the way that is customary in other wafer processing steps, the photoresist profile is sufficiently sloped to produce a sloped profile in the passivation layer; and the sloped profile in the passivation layer is sufficient to prevent the tape residue.

In a conventional step that will be understood from FIG. 1C, a tape is applied to the device side of the wafer, which is now formed by the upper surface 27 of the passivation film 13, the sloping sides 28 of the hole 24 in the passivation layer, and the exposed surface 29 of conductive layer 12. When the grinding operation on the back of the wafer has been completed and the tape is pealed off the device side of the wafer, the tape and the adhesive are removed completely without the particles of adhesive that can otherwise remain on the wafer surfaces.

THE EMBODIMENT OF FIGS. 2A, 2B, AND 2C

FIG. 2A will be familiar from the description of FIG. 1A and from the conventional process step that FIGS. 1A and 2A illustrate. FIG. 2A uses the reference characters of FIG. 1A.

As FIG. 2B shows, the etch operation on the passivation film 13 is carried out through the normal photoresist of FIG. 2A with the sharp edge 19 where the sides 20 of the hole meet the upper surface 21 of photoresist layer 14.

It is a feature of this embodiment of my invention that the hole 30 in the passivation film 13 is formed with an isotropic etch, an etch that operates more or less equally horizontally and vertically.

As a result of the isotropy of this etch, the passivation film 13 is etched significantly under the edge 31 of photoresist layer 14, as FIG. 1B shows. Contrast the limited amount of etching under the photoresist edge 26 in FIG. 1B. This etch gives the surface of hole 30 a convex edge 34, as represented in FIGS. 2B and 2C.

After the etch step of FIG. 1B, the photoresist layer 14 is stripped from the wafer, leaving the passivation layer 13, the conductor layer 12, as shown in FIG. 2C, and the substrate and any structures between the substrate and the conductor layer.

The protective tape is applied to the wafer in the way already described and it adheres to the passivation layer upper surface 35, the sloping surface 36 of the passivation layer around hole 30, and the exposed surface 37 of the conductive layer. The sloped edges and surfaces allow the tape to follow the approximate contour of the wafer surface without sharp edges that might otherwise cut into the adhesive and cause adhesive particles to remain on the wafer surface.

The isotropic etch that is commonly performed in other wafer manufacturing steps is sufficient to give the holes in the passivation layer a suitable profile to avoid tape residue.

It will ordinarily be unnecessary to combine the two methods, using an isotropic etch through the photoresist with the sloping profile shown in FIG. 1B.

OTHER EMBODIMENTS

From the description of two embodiments of my invention, those skilled in the art will recognize modifications and variations within the skill of the art and the spirit of the claims.

What is claimed is:

1. A method for manufacturing a semiconductor wafer comprising,
   completing the wafer manufacturing steps of forming a passivation film on the uppermost conductor surface of the wafer, forming a photoresist layer on the passivation film, and forming holes in the photoresist layer over parts of the conductor surface that will later be connected to external circuit nodes,
   etching the passivation film through the holes in the photoresist layer to form holes in the passivation layer with a sloped profile in which the hole is wider at the top than at the bottom,
   and then placing a tape on the upper surface of the wafer for protecting the upper surface while grinding the back side of the wafer to give the wafer a selected thickness,
   and removing the protective layer without leaving a residue of adhesive.

2. The method of claim 1 wherein the step of etching the passivation layer comprises etching the passivation layer anisotropically.

3. The method of claim 1 wherein the step of etching the passivation film to form holes with a sloped profile comprises exposing the photoresist to a plasma to remove the otherwise sharp edges of the holes to give the photoresist around the holes a sloping profile, and then etching the passivation layer through the holes with the sloping profile to form holes in the passivation layer with a sloping profile.

4. The method of claim 3 wherein the step of removing the otherwise sharp edges of the holes in the photoresist comprises giving the photoresist a profile that slopes sufficiently to produce holes in the passivation layer with a sloping profile on the subsequent steep of etching the passivation layer.

5. The method of claim 4 wherein the step of removing the otherwise sharp edges of the holes in the photoresist comprises exposing the photoresist to a plasma etch.

6. The method of claim 5 wherein the step of exposing the photoresist to a plasma etch comprises exposing the photoresist to an oxygen plasma etch.

7. The method of claim 1 wherein the step of etching the passivation layer comprises etching the passivation layer isotropically.

8. The method of claim 1 wherein the step of etching the passivation film to form holes with a sloped profile comprises
   maintaining the normally sharp edges of the holes in the photoresist and etching anisotopically through the holes in the photoresist to form holes in the passivation layer that have a sloping profile with the hole diameter being larger at the top than at the bottom.

9. A method for manufacturing a semiconductor wafer having a substrate, a wafer back surface and a wafer device surface, a conductor layer overlying the substrate, a passivation film directly overlying the conductor layer, the method comprising,
   forming a photoresist layer directly overlying the passivation film, and exposing the photoresist layer to form holes where the passivation film is to be removed to expose circuit nodes in the conductor layer,
   etching the passivation layer through the holes in the photoresist to form passivation layer holes with a sloping profile with the holes having a greater diameter at the top than at the bottom,
   applying to the device side of the wafer a tape having a backing layer and having an adhesive layer formed on the backing layer, grinding the back side of the wafer while the tape protects the device side of the wafer,
   and pealing off the tape with the adhesive attached to the tape.

10. A wafer comprising a substrate, a conductor layer overlying the substrate and patterned to interconnect circuit nodes below the conductive layer, a passivation layer directly overlying the conductor layer and having holes that expose regions of the conductive layer where wires can be attached for connection to external circuit nodes, the holes having a sloping profile with the upper diameter greater than the lower diameter, the slope being sufficient to prevent the upper edges of the holes from cutting through the adhesive of a protective tape applied to the surface of the passivation layer to protect the wafer during an operation to grind the back side of the wafer.

* * * * *